United States Patent [19]

Papa

[11] 4,098,046

[45] Jul. 4, 1978

[54] GUIDE FRAME FOR SLIDABLE ARTICLES

[75] Inventor: Franco Papa, Cusano Milanino, Italy

[73] Assignee: Societa Italiana Telecomunicazioni Siemens S.p.A., Milan, Italy

[21] Appl. No.: 745,572

[22] Filed: Nov. 29, 1976

[30] Foreign Application Priority Data

Nov. 27, 1975 [IT] Italy .............................. 29710 A/75

[51] Int. Cl.² ........................ E04C 2/38; A47G 19/08
[52] U.S. Cl. ....................................... 52/716; 211/41;
269/296; 269/321 WE; 339/198 GA; 361/415;
361/419; 403/105
[58] Field of Search ................ 52/716, 732, 717, 737;
308/3.6; 339/198 GA; 317/101 DH; 24/255 R;
211/41; 361/41.5; 269/321 WE, 296; 403/105

[56] References Cited

U.S. PATENT DOCUMENTS

| | | | |
|---|---|---|---|
| 3,184,069 | 5/1965 | Rosenberg | 211/41 C |
| 3,382,476 | 5/1968 | Novet | 361/415 X |
| 3,477,770 | 11/1969 | Niemi | 308/3.6 |
| 3,723,823 | 3/1973 | Lit et al. | 361/415 X |
| 3,736,472 | 5/1973 | Muldoon, Jr. | 361/415 X |
| 3,899,721 | 8/1975 | Borchard et al. | 361/415 X |
| 3,950,057 | 4/1976 | Calabro | 361/415 X |
| 4,002,381 | 1/1977 | Wagner et al. | 211/41 X |

OTHER PUBLICATIONS

Taurus, "Circuitrak Printed Circuit Board Holders" Mar. 1975, 9 pp.

*Primary Examiner*—Leslie Braun
*Attorney, Agent, or Firm*—Karl F. Ross

[57] ABSTRACT

A guide frame for the retention of printed-circuit carriers or other slidable articles comprises top and bottom members integrally molded from plastic material, each member including an elongate base with upstanding sidewalls and two sets of cantilevered ribs, the ribs of each set extending inwardly from a respective sidewall at an angle of substantially less than 90° and terminating in a common longitudinally extending bar overhanging the base. The two bars are separated by a distance less than the thickness of a workpiece to be inserted therebetween, the herringbone pattern of the ribs facilitating such insertion from one end but impeding a withdrawal toward that end.

10 Claims, 4 Drawing Figures

GUIDE FRAME FOR SLIDABLE ARTICLES

FIELD OF THE INVENTION

My present invention relates to a guide frame for slidable articles, such as printed-circuit carriers or other electrical components, that are to be operatively juxtaposed with coacting units.

BACKGROUND OF THE INVENTION

Guide frames of the type referred to, especially in devices where the articles to be received therein are subject to impact or vibrations, usually consist of a metal or alloy combining the necessary mechanical strength with a certain degree of elasticity. Such metallic guides are relatively expensive, but attempts to substitute cheaper plastic structures have met only with limited success in devices of the kind here envisaged in which high-precision guidance is required. This is particularly true with heavier electronic components such as radio-frequency modules which carry their own shielding to prevent electromagnetic interaction with neighboring units. Thus, plastic guide members sturdy enough to support such articles generally lack the resiliency necessary to grip them without play while absorbing shocks or vibrations.

Conventional guide frames, furthermore, are usually encumbered by special detents designed to prevent dislodgment of the inserted article under its own weight or in the presence of vibrations.

OBJECT OF THE INVENTION

The general object of my present invention, therefore, is to provide an improved guide frame for the purpose described whose members can be integrally molded from plastic material while satisfying the requirements for sturdiness and resiliency.

Another object is to design a guide frame of this description in such a manner as to prevent the spontaneous disengagement of an article inserted into it, without the need for separate retaining means.

SUMMARY OF THE INVENTION

In accordance with my present invention I provide an integrally molded frame member of plastic material having an elongate base of rectangular outline with a pair of sidewalls rising from its major edges. Cantilevered on the sidewalls are two sets of ribs which extend toward each other at an acute angle to these major edges, preferably between about 30° and 60°, in a herringbone pattern lying substantially in a plane parallel to and spaced from the base. The ribs terminate, at their inner ends remote from the sidewalls, in two bars overhanging the base parallel to its major edges, the bars being separated by a distance less than the thickness of an article to be received therebetween. Such an article, thanks to the herringbone pattern and the inherent elasticity of the material which gives the bars a certain mobility with reference to the underlying base, can be inserted endwise into the gap or channel between the bars by unidirectional sliding whereas its extraction in the opposite direction is materially impeded.

The frame-engaging portion of the article here considered, to be inserted into the gap between the bars, may have a pair of continuous guide surfaces as would be true, for example, of a printed-circuit board. Such continuity, however, is not essential inasmuch as the bars could also grip a plurality of spaced-apart lugs on, say, a radio-frequency module.

BRIEF DESCRIPTION OF THE DRAWING

The above and other features of my invention will now be described with reference to the accompanying drawing in which.

SPECIFIC DESCRIPTION

Figure 1:
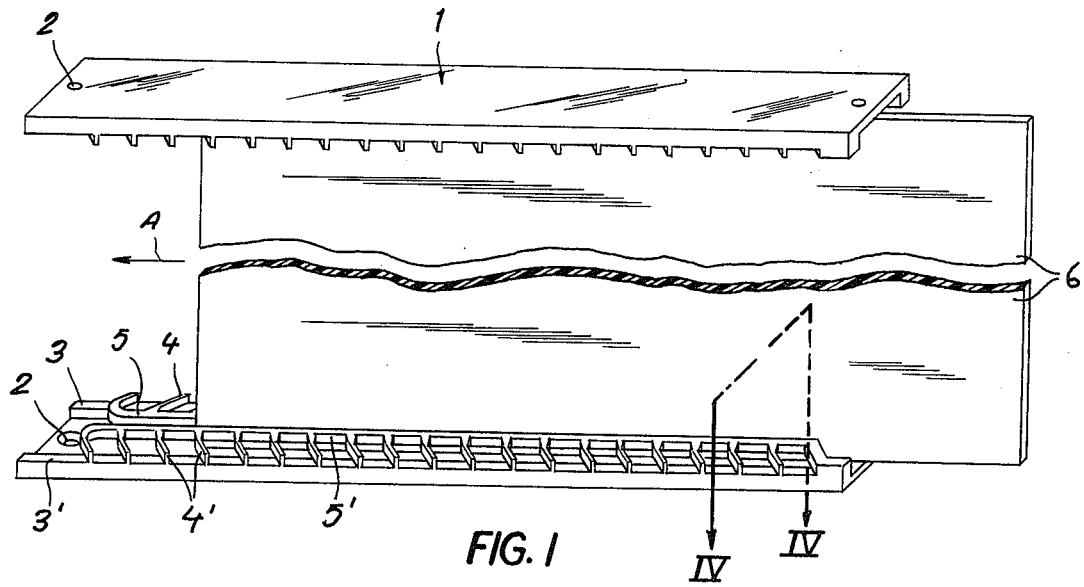
FIG. 1 is an isometric view of two frame members according to the invention engaging a printed-circuit board.

In FIG. 1 I have shown a pair of horizontal, identical frame members forming part of a guide structure, not further illustrated, for the insertion of an upright article 6 such as a printed-circuit board in a horizontal direction A, i.e. from right to left. Each frame member, molded in one piece from plastic material, comprises an elongate rectangular base 1 with sidewalls 3, 3' rising from the major edges of the rectangle. Integrally cantilevered on these sidewalls are two mutually symmetrical sets of ribs 4, 4' including an acute angle, here of about 45°, with these sidewalls and therefore with the major dimension of the base 1. The ribs 4 and 4' terminate at their inner ends, remote from sidewalls 3 and 3', in respective bars 5 and 5' parallel to these sidewalls and to the base 1, the bars extending longitudinally of the frame member over almost the entire length thereof. Confronting faces $f$ and $f'$ of bars 5 and 5' are normally separated, in the absence of a board 6, by a distance less than the thickness of that board so as to be slightly spread apart upon the endwise introduction of the board into the frame. Mounting holes 2 on base 1 enable the fastening of the two frame members to the nonillustrated overall structure by rivets or screws.

Figure 2:
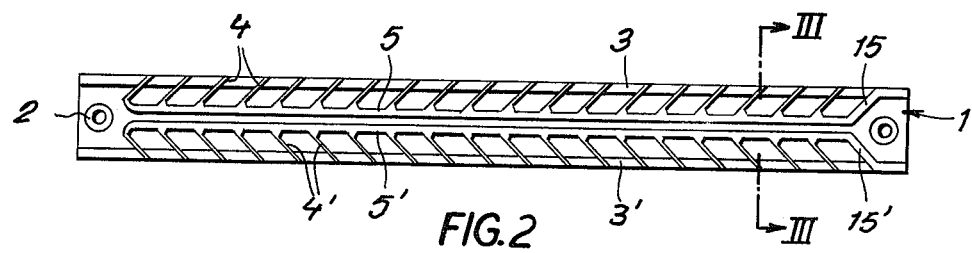
FIG. 2 is a plan view of one of the frame members shown in FIG. 1.
Figure 3:
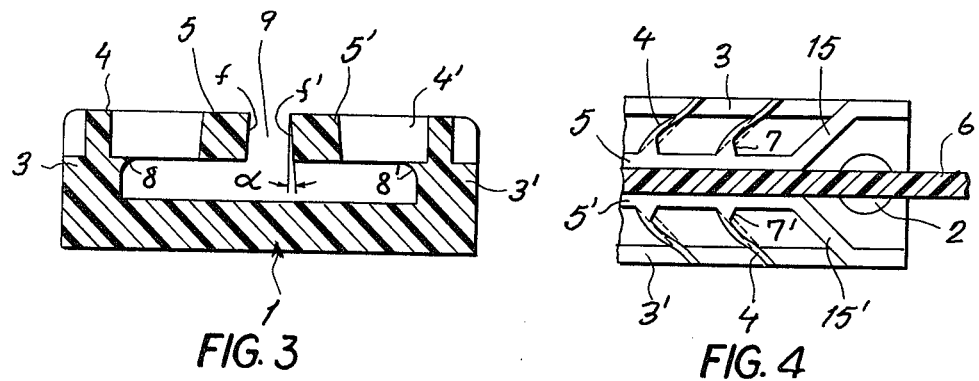
FIG. 3 is a cross-sectional view, drawn to a larger scale, taken on the line III—III of FIG. 2.
Figure 4:
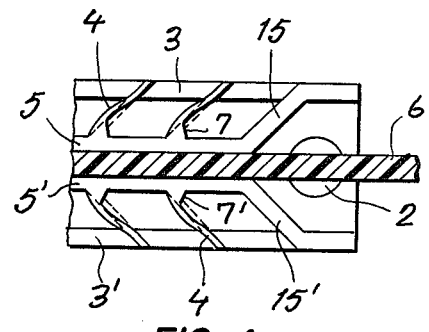
FIG. 4 is a fragmentary sectional view, also drawn to a larger scale, taken on the line IV—IV of FIG. 1.

At the insertion end of the frame, shown at right in FIGS. 1 and 2, the bars 5, 5' terminate in generally S-shaped extremities 15, 15' which are directly connected with the ends of sidewalls 3, 3' and whose thickness, like that of the bars themselves, is somewhat greater than that of the ribs 4, 4'. The ribs, as best seen in FIG. 3, have a rectangular cross-section whose height equals that of the bars 5, 5' (as well as that of their extremities 15, 15') and greatly exceeds the width of these ribs which also is considerably less than that of the sidewalls 3, 3'; in the illustrated embodiment, the sidewalls and the bars have substantially the same width. At their inner ends adjoining the bars 5 and 5', the ribs 4 and 4' are enlarged to form somewhat heavier junctions 7 and 7' with these bars; the sidewalls 3, 3" are faired at 8, 8' into the undersurfaces of the ribs proximal to base 1.

I have found that, by virtue of the greater deformability of the upper edges of the ribs, the insertion of a board 6 or the like into the gap between the bars 5 and 5' tends to twist these bars about their longitudinal axis so as to enlarge the intervening gap 9 at its top. If the confronting faces $f, f'$ of the bars were normally parallel to each other and perpendicular to base 1, such a deformation would result in an engagement of the board 6 by only the lower edges of the bar faces which on the one hand could objectionably bite into the board's surface, thereby possibly damaging its printed circuitry, and on the other hand would exert upon the board an upward force tending to expel it from the frame member. In order to avoid these drawbacks, we prefer to incline the two confronting bar faces at a small angle α to a direction perpendicular to the plane of the ribs, with the result that the aforementioned twist brings the faces $f, f$ into substantial parallelism with each other for full area contact with the inserted board.

Naturally, the frictional force with which the board 6 is gripped by the bars 5, 5' depends on the elasticity of the plastic material (e.g. a polycarbonate) as well as on the chosen angle of inclination of the ribs 4, 4' to the longitudinal direction of the frame member, that angle ranging preferably between about 30° and 60°. The smooth transition points at 7, 7' and 8, 8' as well as the generally S-shaped configuration of the bar extremities 15, 15' prevent the development of excessive stresses anywhere in the frame member. Since the outer ends of the ribs overlie the sidewalls 3, 3' over their full width, a substantial portion of the bending stresses imparted to the ribs is absorbed by the base 1 and its sidewalls.

With the arrangement shown I have been able to provide a directional differential making the force required for removal of an article about 1.2 to 1.3 times that of the force required for insertion.

I claim:

1. An integrally molded frame member of plastic material for the guidance and retention of a slidable article having a frame-engaging portion of predetermined thickness, comprising:
    an elongate base of rectangular outline with a pair of sidewalls rising from said base along the major edges of the rectangle;
    two sets of ribs cantilevered on said sidewalls and extending toward each other at an acute angle to said edges in a herringbone pattern, said ribs being substantially parallel to and spaced from said base; and
    two bars parallel to said edges overhanging said base and movable with reference thereto, each of said bars being connected with the ribs of a respective set at inner ends thereof remote from said sidewalls, said bars being separated by a distance less than said thickness to form a gap for the endwise insertion of said article in a single direction only, said bars having confronting faces diverging from each other toward said base in a plane transverse to said base.

2. A frame member as defined in claim 1 wherein said ribs are of substantially rectangular cross-section with a height equaling that of said bars and with a width substantially less than said height.

3. A frame member as defined in claim 2 wherein said sidewalls are faired into said ribs at the minor sides of their cross-section proximal to said base.

4. A frame member as defined in claim 1 wherein said sets of ribs are symmetrical with each other.

5. A frame member as defined in claim 1 wherein said bars have generally S-shaped extremities rigid with said ribs at an insertion end of said herringbone pattern.

6. A frame member as defined in claim 5 wherein said extremities are heavier than said ribs.

7. A frame member as defined in claim 1 wherein said acute angle ranges between substantially 30° and 60°.

8. An integrally molded frame member of plastic material for the guidance and retention of a slidable article having a frame-engaging portion of predetermined thickness, comprising:
    an elongate base of rectangular outline with a pair of sidewalls rising from said base along the major edges of the rectangle;
    two sets of ribs cantilevered on said sidewalls and extending toward each other at an acute angle to said edges in a herringbone pattern, said ribs being substantially parallel to and spaced from said base; and
    two bars parallel to said edges overhanging said base and movable with reference thereto, each of said bars being connected with the ribs of a respective set at inner ends thereof remote from said sidewalls, said bars being separated by a distance less than said thickness to form a gap for the endwise insertion of said article in a single direction only, said ribs being of substantially rectangular cross-section with a height equaling that of said bars and with a width substantially less than said height, said sidewalls being faired into said ribs at the minor sides of their cross-section proximal to said base.

9. A frame member as defined in claim 8 wherein said ribs have outer ends rigid with said sidewalls extending over the full width of the latter.

10. A frame member as defined in claim 8 wherein said ribs form broadened junctions with said bars at said inner ends.

* * * * *